(12) United States Patent
Lee et al.

(10) Patent No.: US 10,347,692 B2
(45) Date of Patent: Jul. 9, 2019

(54) ORGANIC LIGHT EMITTING DISPLAY DEVICE

(71) Applicant: LG DISPLAY CO., LTD., Seoul (KR)

(72) Inventors: Taeyoung Lee, Goyang-si (KR); Changwoo Lee, Seoul (KR); Osung Do, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 77 days.

(21) Appl. No.: 15/792,285

(22) Filed: Oct. 24, 2017

(65) Prior Publication Data

US 2018/0114815 A1    Apr. 26, 2018

(30) Foreign Application Priority Data

Oct. 25, 2016 (KR) .................. 10-2016-0139528

(51) Int. Cl.

| H01L 27/32 | (2006.01) |
|---|---|
| G06K 9/00 | (2006.01) |
| G09F 9/30 | (2006.01) |
| H01L 51/50 | (2006.01) |
| H01L 51/52 | (2006.01) |
| H01L 51/56 | (2006.01) |

(Continued)

(52) U.S. Cl.
CPC ............ *H01L 27/32* (2013.01); *G06K 9/0004* (2013.01); *G06K 9/00013* (2013.01); *G09F 9/30* (2013.01); *H01L 27/3244* (2013.01); *H01L 51/0031* (2013.01); *H01L 51/50* (2013.01); *H01L 51/5203* (2013.01); *H01L 51/56* (2013.01); *H05B 33/02* (2013.01); *H05B 33/22* (2013.01); *H05B 33/28* (2013.01)

(58) Field of Classification Search
CPC ......... H01L 27/32; H01L 51/50; H01L 51/56; H01L 51/5203; H01L 51/0031; H01L 51/52; G09F 9/30; H05B 33/22; H05B 33/02; H05B 33/28; G06K 9/00013; G06K 9/00

See application file for complete search history.

(56) References Cited

U.S. PATENT DOCUMENTS

| 9,762,829 B2 * | 9/2017 | Choi ................... H04N 5/378 |
| 2005/0110103 A1 * | 5/2005 | Setlak ................. G06K 9/0002 |
| | | 257/414 |

(Continued)

*Primary Examiner* — Vinh T Lam
(74) *Attorney, Agent, or Firm* — Birch, Stewart, Kolasch & Birch, LLP

(57) ABSTRACT

An organic light emitting display device in an embodiment of the present invention comprises a display panel equipped with a plurality of pixels each including an OLED and a driving TFT for driving the OLED and a sensing circuit connected to pixels through a sensing line and detecting driving characteristics of a corresponding pixel. The sensing circuit may comprise a plural sensing units including an integrator for integrating currents respectively flowing two adjacent sensing lines connected to inverting and non-inverting input terminals of a fully differential amplifier, a sampling unit for respectively sampling two integral outputs of the integrator and a scaler for regulating an operating range of outputs of the sampling unit, a differential amplifier for differentially amplifying one or more outputs of the scaler, and an ADC for converting an output of the differential amplifier into a digital sensing value.

11 Claims, 10 Drawing Sheets

(51) Int. Cl.
    *H05B 33/02*     (2006.01)
    *H05B 33/22*     (2006.01)
    *H05B 33/28*     (2006.01)
    *H01L 51/00*     (2006.01)

(56) References Cited

U.S. PATENT DOCUMENTS

| | | | |
|---|---|---|---|
| 2015/0187278 A1* | 7/2015 | Park | G09G 3/3291 |
| | | | 345/212 |
| 2017/0046006 A1* | 2/2017 | Kim | G02F 1/13338 |
| 2018/0254006 A1* | 9/2018 | Hwang | G09G 3/32 |

* cited by examiner

ORGANIC LIGHT EMITTING DISPLAY DEVICE

CROSS-REFERENCE TO RELATED APPLICATIONS

This application claims the benefit of priority under 35 U.S.C. § 119(a) to Korean Patent Application No. 10-2016-0139528 filed on Oct. 25, 2016, which is incorporated by reference herein in its entirety into the present application.

BACKGROUND

Field

The present invention relates to an organic light emitting display device for improving the structure of a sensing unit for detecting the electrical characteristics of a driving thin film transistor (TFT) for driving an organic light emitting pixel.

Related Art

An active matrix type organic light emitting display covers an organic light emitting diode (OLED) which emits light by itself, and has advantages of a fast response speed, high light emitting efficiency, high brightness, and a wide viewing angle.

The organic light emitting display device arranges pixels each including an organic light emitting diode OLED and a driving TFT in a matrix form and adjusts the luminance of an image implemented in the pixel according to the gradation of video data. The driving TFT controls the driving current flowing through the OLED according to the voltage between its gate electrode and its source electrode. The light emission amount of the OLED is determined according to the driving current, and the luminance of the image is determined according to the light emission amount of the OLED.

When the driving TFT operates in a saturation region, the pixel current flowing between the drain and the source electrode of the driving TFT is changed depending on the electrical characteristics of the driving TFT such as a threshold voltage and an electron mobility. The electrical characteristics of the driving TFTs vary among pixels due to various causes such as process characteristics and time-varying characteristics. Thus even if a same data voltage is applied to pixels having different electrical characteristics of the driving TFT, a luminance deviation is generated for each pixel. Unless the characteristic deviations are compensated, it is difficult to realize a desired quality image.

In order to address this problem, there has been proposed a technique of compensating a luminance deviation due to deviations of electrical characteristics (threshold voltage, mobility) of the driving TFT outside and/or inside a pixel. An external compensation method senses a characteristic parameter of the driving TFT for each pixel and adjusts input data according to a sensing value to precisely compensate the luminance deviation among pixels, but is disadvantageous in that it takes much time for sensing. On the other hand, an internal compensation method can compensate the luminance deviation in real time, but has a disadvantage in that the pixel structure is complex and an aperture ratio is low.

In the external compensation method, the sensing line for sensing the characteristics of the driving TFT is connected to each pixel, and the sensing unit for detecting the current or voltage flowing the sensing line and reflecting the characteristics of the driving TFT is imbedded in a data driving circuit. The source drive IC for applying data voltage to pixels and sensing the characteristics of the driving TFTs is disposed in the outer non-display area of a display panel and is covered by a bezel.

The sensing unit which senses the characteristics of the driving TFT by using the current through the sensing line comprises an integrator, a sampling unit, a scaler, an analog-to-digital converter (ADC), etc. The sensing unit includes an OP Amp of the integrator and a scaler per sensing line, so that the sensing unit occupies a large area.

SUMMARY

The present invention has been made in view of the above circumstances. It is an object of the present invention to reduce a physical size of the sensing unit for sensing the characteristics of the driving TFTs in display devices.

It is another object of the present invention to reduce the influence of a noise when the sensing unit senses the characteristics of the driving TFTs in a current form.

It is yet another object of the present invention to provide the structure of the sensing unit capable of changing the operation mode of detecting the characteristics of the driving TFTs.

The circuit for detecting driving characteristics of an OLED according to an embodiment of the present invention may comprise an integrator for integrating currents which respectively flow two adjacent sensing lines connected to an inverting input terminal and a non-inverting input terminal of a fully differential amplifier, the sensing line being connected to a driving TFT for driving the OLED constituting a pixel of a display panel; a sampling unit for respectively sampling two integral outputs of the integrator; a differential amplifier for differentially amplifying one or more sampling outputs of the sampling unit; and an analog-to-digital converter (ADC) for converting an output of the differential amplifier into a digital sensing value.

In an embodiment, the circuit may further comprise a scaler for respectively converting two sampling outputs of the sampling unit into an operating range of the ADC and outputting a result to the differential amplifier.

In an embodiment, the circuit may further comprise first and second sensing switches for respectively coupling the inverting input terminal and the non-inverting input terminal to the two sensing lines so as to disconnect at a time of display driving for making the OLED emit light and to connect at a time of sense driving for detecting the driving characteristics of the OLED; and first and second mode switches for respectively coupling two sampling outputs of the sampling unit to two input terminals of the differential amplifier.

In an embodiment, the integrator may comprise a first capacitor and a first reset switch connecting the inverting input terminal and a non-inverting output terminal of the fully differential amplifier and a second capacitor and a second reset switch connecting the non-inverting input terminal and an inverting output terminal of the fully differential amplifier, and a common output terminal of the fully differential amplifier is connected to a reference voltage to be applied to a source electrode of the driving TFT.

In an embodiment, the sampling unit may comprise first and second sampling capacitors and first and second sampling switches for respectively coupling first terminals of the first and second sampling capacitors to the non-inverting output terminal and the inverting output terminal, and second terminals of the first and second sampling capacitors are connected to a second reference voltage related to an operating range of the ADC.

In an embodiment, the first mode switch may selectively connect a first sampling output or a second sampling output to a first input terminal of the differential amplifier, and the second mode switch may selectively connect the second sampling output or a third reference voltage to a second input terminal of the differential amplifier.

In an embodiment, in a first mode using a difference value between sensing values of the two sensing lines, the first mode switch may connect the first input terminal of the differential amplifier to the first sampling output and the second mode switch may connect the second input terminal of the differential amplifier to the second sampling output. In a second mode using a difference value between each sensing value of the two sensing lines and a predetermined reference value, the first mode switch may connect the first input terminal of the differential amplifier to the first sampling output and the second mode switch may connect the second input terminal of the differential amplifier to the third reference voltage, or the first mode switch may connect the first input terminal of the differential amplifier to the second sampling output and the second mode switch may connect the second input terminal of the differential amplifier to the third reference voltage.

In an embodiment, the circuit may further comprise a first reference switch for coupling a first input terminal of the differential amplifier to a third reference voltage; and a second reference switch for coupling a second input terminal of the differential amplifier to a third reference voltage.

In an embodiment, in a first mode using a difference value between sensing values of the two sensing lines, the first mode switch may connect the first input terminal of the differential amplifier to the first sampling output and the second mode switch may connect the second input terminal of the differential amplifier to the second sampling output. In a second mode using a difference value between each sensing value of the two sensing lines and a predetermined reference value, the first mode switch may connect the first input terminal of the differential amplifier to the first sampling output and the second reference switch may connect the second input terminal of the differential amplifier to the third reference voltage, or the second mode switch may connect the second input terminal of the differential amplifier to the second sampling output and the first reference switch may connect s the first input terminal of the differential amplifier to the third reference voltage.

In an embodiment, during an initialization section, the first and second sensing switches, the first and second reset switches, and the first and second sampling switches are turned on and the reference voltage is applied to a source electrode of the driving TFT. During a sampling section, the first and second reset switches are turned off, a data voltage for sensing is applied to a gate electrode of a first driving TFT connected to one of the two sensing lines to turn on the first driving TFT, a predetermined data voltage is applied to a second driving TFT connected to the other of the two sensing lines to turn off the second driving TFT, one of the first and second sampling capacitors stores a first integral output which the integrator integrates a current flowing the source electrode of the first driving TFT to output, and the other of the first and second sampling capacitors stores a second integral output which the integrator integrates a current flowing the source electrode of the second driving TFT to output. And, during a conversion section, the first and second sampling switches are turned off, the first and second mode switches are turned on, and the differential amplifier and the ADC convert a difference between the first and second integral outputs stored in the first and second sampling capacitors into a digital value.

The organic light emitting display device according to another embodiment of the present invention may comprise a display panel equipped with a plurality of pixels each of which includes an OLED and a driving TFT for driving the OLED; and a sensing circuit connected to one or more pixels through a sensing line and detecting driving characteristics of a corresponding pixel. The sensing circuit may comprise: a plurality of sensing units including an integrator for integrating currents which respectively flow two adjacent sensing lines connected to an inverting input terminal and a non-inverting input terminal of a fully differential amplifier, a sampling unit for respectively sampling two integral outputs of the integrator; and a scaler for regulating an operating range of outputs of the sampling unit; a differential amplifier for differentially amplifying one or more outputs of the scaler; and an ADC for converting an output of the differential amplifier into a digital sensing value.

In an embodiment, the sensing unit may further comprise: first and second sensing switches for respectively coupling the inverting input terminal and the non-inverting input terminal to the two sensing lines so as to disconnect at a time of display driving for making the OLED emit light and to connect at a time of sense driving for detecting the driving characteristics of the OLED; and first and second mode switches for respectively coupling two sampling outputs of the sampling unit to two input terminals of the differential amplifier.

In an embodiment, the integrator may comprise a first capacitor and a first reset switch connecting the inverting input terminal and a non-inverting output terminal of the fully differential amplifier and a second capacitor and a second reset switch connecting the non-inverting input terminal and an inverting output terminal of the fully differential amplifier, and a common output terminal of the fully differential amplifier is connected to a reference voltage to be applied to a source electrode of the driving TFT.

In an embodiment, the sampling unit may comprise first and second sampling capacitors and first and second sampling switches for respectively coupling first terminals of the first and second sampling capacitors to the non-inverting output terminal and the inverting output terminal, and second terminals of the first and second sampling capacitors are connected to a second reference voltage related to an operating range of the ADC.

In an embodiment, during a first period, a data voltage for sensing which can turn on the driving TFT is applied to a pixel connected to an odd sensing line, a predetermined data voltage which cannot turn on the driving TFT is applied to a pixel connected to an even sensing line, the plurality of sensing units are driven simultaneously to obtain a plurality of first and second scaling outputs, and the first and second mode switches are controlled such that the plurality of sensing units are sequentially connected to the differential amplifier and when each sensing unit is connected to the differential amplifier the differential amplifier and the ADC are driven to output a digital sensing value for the pixels connected to the odd sensing lines related to a corresponding sensing unit. And, during a second period following the first period, the predetermined data voltage which cannot turn on the driving TFT is applied to a pixel connected to an odd sensing line, a data voltage for sensing which can turn on the driving TFT is applied to a pixel connected to an even sensing line, the plurality of sensing units are driven simultaneously to obtain a plurality of first and second scaling outputs, and the first and second mode switches are controlled such that the plurality of sensing units are sequentially connected to the differential amplifier and when each sensing unit is connected to the differential amplifier the differential amplifier and the ADC are driven to output a digital sensing value for the pixels connected to the even sensing lines related to a corresponding sensing unit.

Accordingly, it is possible to reduce the area of the source drive IC included in the data drive circuit by reducing the number of the amplifiers and the scalers in half compared with a conventional structure of the sensing unit.

Furthermore, as the size of the source IC decreases, the number of source ICs that each wafer can produce increases, and as a result the cost of the source IC can be lowered.

Furthermore, by differentially amplifying the integrated values of the currents flowing through two sensing lines adjacent to each other in a fully differential manner, it is possible to detect the characteristics of the driving TFTs while reducing the influence of noise mixed in the current on the sensing line.

In addition, the sensing unit can be configured for general use such that a CDS operation mode for differentially amplifying integrated values of currents flowing in two neighboring sensing lines and a general operation mode for differential amplifying the integrated value of currents flowing in one sensing line with a reference value can be switched to each other.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
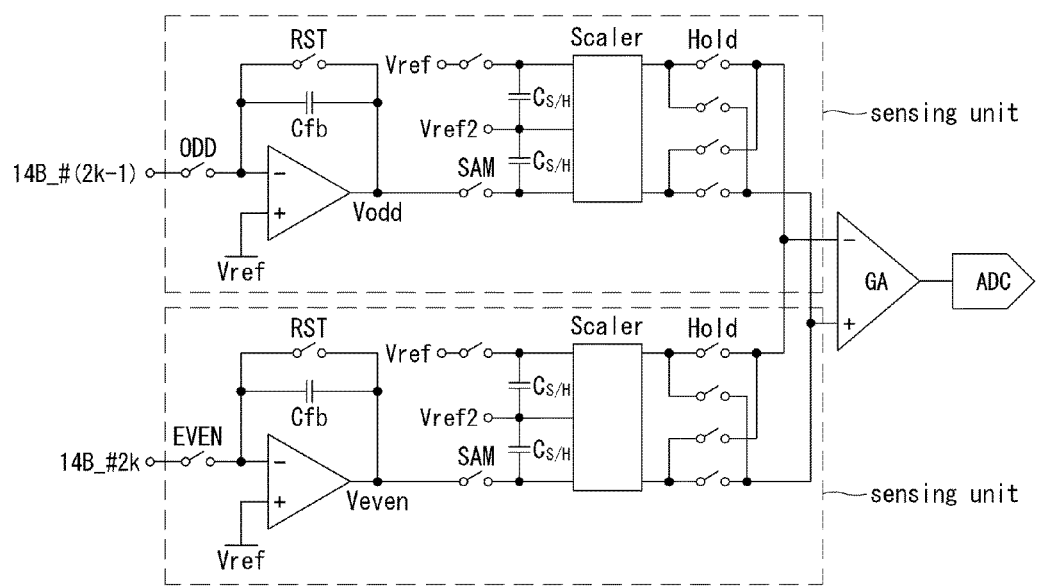
FIG. 1 shows a conventional sensing circuit configuration for detecting the characteristics of a pixel using a current.

Hereinafter, preferred embodiments of the present invention will be described in detail with reference to the accompanying drawings. Same reference numerals throughout the specification denote substantially identical components. In the following description, a detailed description of known functions and configurations incorporated herein will be omitted when it may make the subject matter of the present invention rather unclear. The term 'may' encompasses the full meanings of the term 'can'.

FIG. 1 shows a conventional sensing circuit configuration for detecting the characteristics of a pixel using a current.

When detecting the driving characteristics of a pixel by using a current, noise is a problem and a solution for solving the problem is indispensable. The sensing circuit in FIG. 1 is configured to differentially amplify the sensing values of two neighboring sensing lines by applying a correlated double sampling (CDS) method to reduce noise.

The CDS method samples the value driven by a reference value and transferred to an output node, samples the value driven by a normal value and transferred to the output node, and then obtains the different values between the two sampled values. However, the CDS method cannot be directly applied to the detection of the driving characteristics of a pixel. So, assuming that the values of neighboring sensing lines have similar noise, for example, odd-numbered lines are driven normally and sensed, even-numbered lines are driven at the reference value and sensed, and then the sensing values are differentially amplified. So, the noise component included in the sensing values can be reduced.

In FIG. 1, the sensing circuit may comprise the sensing unit which integrates, samples and scales the current flowing the sensing line, the differential amplifier (Global Amplifier, GA) which differentially amplifies the outputs of two sensing units connected to two adjacent sensing lines (Even/Odd), and the analog-to-digital converter ADC which converts the output of the differential amplifier into a digital value.

The sensing unit may comprise the current integrator for integrating the current flowing the sensing line, the sampling unit for sampling the output of the current integrator, a scaler for adjusting the sampling value to within an ADC's operating range, and a plurality of switches.

The current integrator comprises a differential amplifier, a feedback capacitor Cfb for connecting the inverting terminal and the output terminal of the differential amplifier, and a reset switch RST connected to the capacitor in parallel. The inverting terminal is connected to the sensing line through a sensing switch, and a non-inverting terminal is connected to a reference voltage Vref. The sensing switches ODD/EVEN are connected only during a sense driving during which a current value of the sensing line is detected, and disconnected during a display driving during which pixels emit light.

The sampling unit may comprise a sampling switch SAM for controlling the connection to the current integrator and a sampling capacitor CS/H for storing a value integrated by the current integrator. Two or more sampling outputs whose levels are controlled by the scaler are input to the input terminal of the differential amplifier GA through two or more switches (Hold).

In order to differentially amplify the sensing values of two sensing lines, a sensing operation is performed while the sense driving is divided into a first period (an odd line sensing period) and a second period (an even line sensing period).

During the first period, a data voltage for sensing is applied to the pixel connected to the odd sensing line, the current flowing the source electrode of the driving TFT is sensed through the odd sensing line, a data voltage for turning off the driving TFT is applied to the pixel connected to the even sensing line, the current (corresponding to a noise component) flowing the source electrode of the driving TFT is sensed through the even sensing line, and then the sensed current values are differentially amplified and converted into a digital sensing value.

During the second period, a data voltage for sensing is applied to the pixel connected to the even sensing line, the current flowing the source electrode of the driving TFT is sensed through the even sensing line, a data voltage for turning off the driving TFT is applied to the pixel connected to the odd sensing line, the current (corresponding to a noise component) flowing the source electrode of the driving TFT is sensed through the odd sensing line, and then the sensed current values are differentially amplified and converted into a digital sensing value.

In the sense driving, the first and second periods may be divided into an initialization section, a sensing section and a conversion section, respectively.

During the initialization section of the sense driving, the reset switch RST is connected so the reference voltage of the non-inverting terminal is applied to the source electrode of the driving TFT connected through the sensing line. During the sensing section of the sense driving, the reset switch RST is disconnected, the sampling switch SAM is connected, the data voltage for sensing is applied to the pixel connected to the odd sensing line (or even sensing line) so a corresponding driving TFT is turned on, a predetermined data voltage is applied to the pixel connected to the even sensing line (or odd sensing line) so a corresponding driving TFT is turned off, and the current flowing the source electrode of the driving TFT is transferred to the current integrator through the sensing line, integrated and stored as a sampling value in the sampling capacitor CS/H of the sampling unit. During the conversion section of the sense driving, the sampling switch SAM is disconnected, the switches (Hold) between the scaler and the differential amplifier are connected, the differential amplifier GA differentially amplifies the output of the odd sensing unit connected to the odd sensing line and the output of the even sensing unit connected to the even sensing line, and the ADC converts the output of the differential amplifier into a digital sensing value.

In FIG. 1, the sampling unit is configured not only to sample the output of the current integrator but also to sample the reference voltage Vref, and 8 switches are disposed between the scaler and the differential amplifier. This is for applying the indirect differential amplification method in which the differential value between a sensing value of the sensing line and the reference value is obtained for each sensing line and then two differential values are subtracted from one to the other while not differentially amplifying the sensing values of the odd sensing line and the even sensing line directly. That is, the sensing value Ssl_odd of the odd sensing line and the value Sref_even sampled for the reference voltage of the even sensing unit are differentially amplified (Ssl_odd−Sref_even) to be converted into a digital value, the sensing value Ssl_even of the even sensing line and the value Sref_odd sampled for the reference voltage of the odd sensing unit are differentially amplified (Ssl_even−Sref_odd) to be converted into a digital value, and then the differential value thereof ((Ssl_odd−Sref_even)−(Ssl_even−Sref_odd)=(Ssl_odd−Ssl_even)) is obtained. Of course, one of the sensing value Ssl_odd of the odd sensing line and the sensing value Ssl_even of the even sensing line is a value obtained by applying the data voltage for sensing to a corresponding pixel and the other is a value obtained by applying the predetermined data voltage for turning off a driving TFT to a corresponding pixel. The sensing line to which the data voltage for sensing is applied may be changed alternately between the first period and the second period.

In the sensing circuit of FIG. 1, the sensing unit is equipped for each sensing line, and each sensing unit comprises an OP amplifier and a scaler, so the size of the source drive IC including the sensing circuit becomes large.

The embodiments of the present invention are to solve or address the problems associated with the conventional devices, and provide the sensing units for two sensing lines as one by using a fully differential amplifier FDA, thereby reducing the problematic noise in a current detection scheme and reducing the area of the source drive IC.

Figure 2:
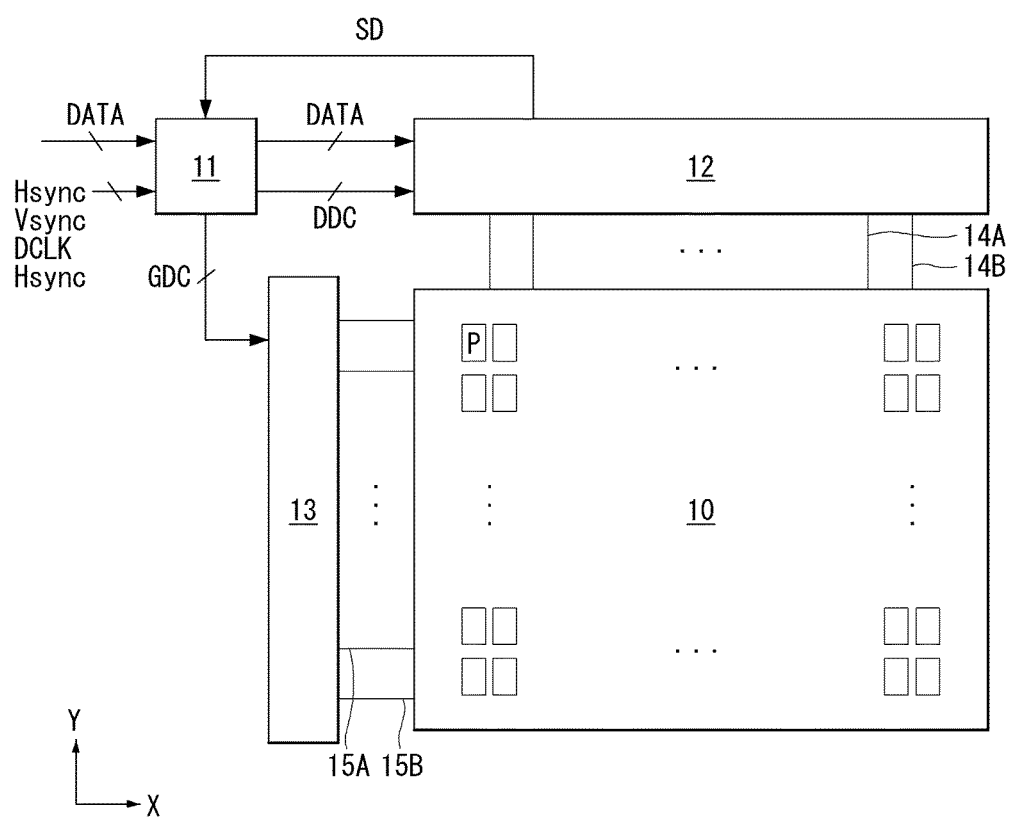
FIG. 2 is a block diagram illustrating a driving circuit of an organic light emitting display device according to an embodiment of the present invention.
Figure 3:
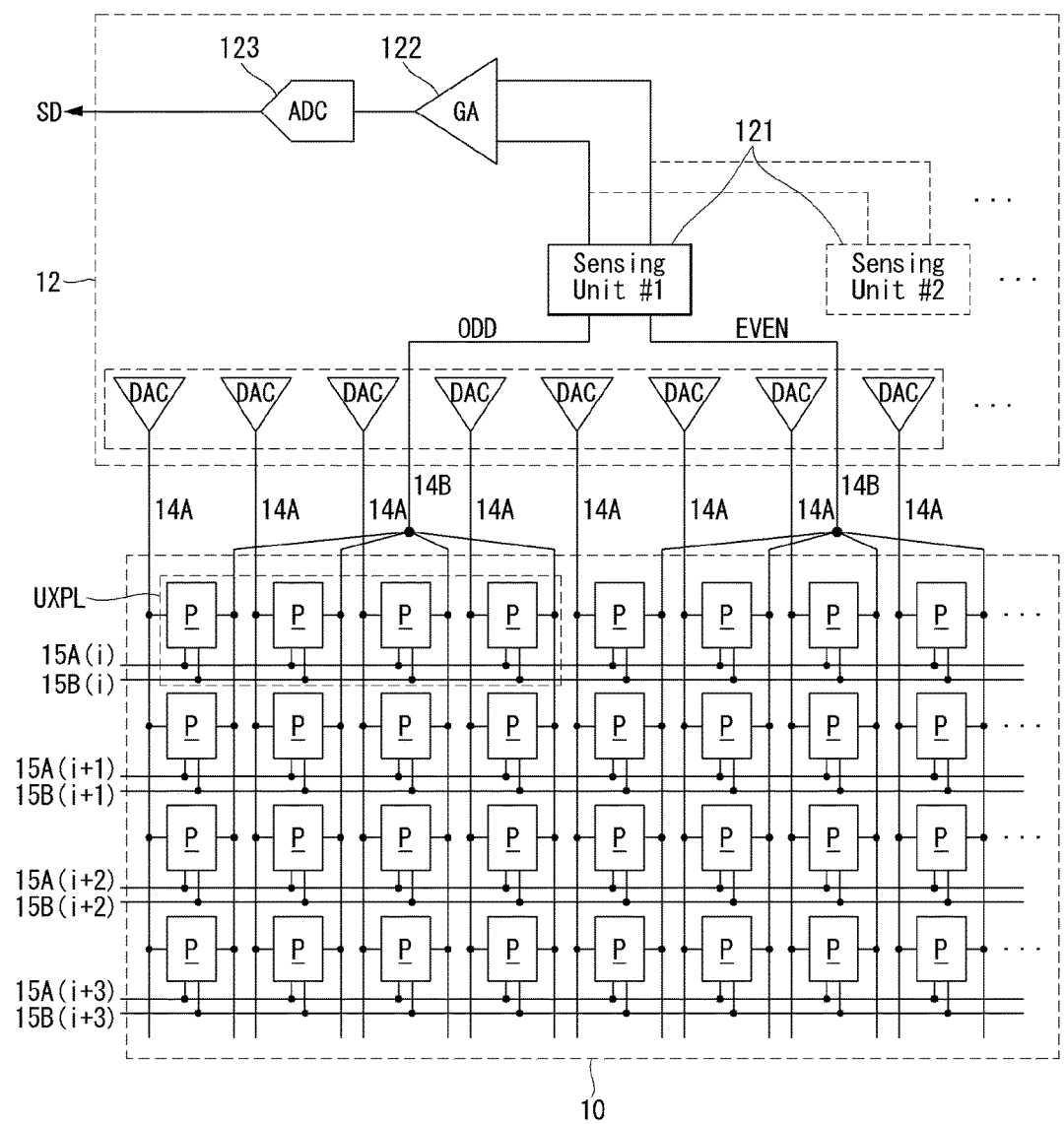
FIG. 3 shows a configuration of a pixel array and a source drive IC for implementing a current sensing method according to an embodiment of the present invention.

FIG. 2 is a block diagram illustrating a driving circuit of an organic light emitting display device according to an embodiment of the present invention, and FIG. 3 shows a configuration of a pixel array and a source drive IC for implementing a current sensing method according to an embodiment of the present invention. All the components of the organic light emitting display device according to all embodiments of the present invention are operatively coupled and configured.

Referring to FIGS. 2 and 3, the organic light emitting display device according to an embodiment of the present invention may comprise a display panel 10, a timing controller 11, a data driving circuit 12 and a gate driving circuit 13.

A plurality of data lines 14 and a plurality of sensing lines and a plurality of gate lines (or scan lines) 15 cross each other on the display panel 10, and the pixels P are arranged in a matrix form to constitute a pixel array. The plurality of gate lines 15 may include a plurality of first gate lines 15A to which first scan signals SCAN are supplied and a plurality of second gate lines 15B to which second scan signals SEN are supplied.

Each pixel is connected to any one of the data lines 14A, any one of the sensing lines 14B, any one of the first gate lines 15A, and any one of the second gate lines 15B.

The pixel P is supplied with a high potential drive voltage EVDD and a low potential drive voltage EVSS from a not-shown power supply, and may comprise an OLED, a driving TFT, a storage capacitor, a first switch TFT and a second switch TFT. The TFTs constituting the pixel P may be implemented as a p-type or an n-type or as a hybrid type in which P-type and N-type are mixed. In addition, the semiconductor layer of the TFTs may include amorphous silicon, polysilicon, or an oxide.

In the driving circuit or the pixel of the present invention, the switch elements may be implemented by the transistor of a n-type Metal Oxide Semiconductor Field Effect Transistor MOSFET or a p-type MOSFET. The following embodiments are illustrated with the n-type transistor, but the present invention is not limited thereto. A transistor is the element of 3 electrodes including a gate, a source and a drain. The source is an electrode for supplying a carrier to the transistor. Within the transistor the carrier begins to flow from the source. The drain is an electrode from which the carrier exits the transistor. That is, the flow of carriers in the MOSFET is from the source to the drain. In the case of an N-type MOSFET (NMOS), since the carrier is an electron, the source voltage has a voltage lower than the drain voltage so that electrons can flow from the source to the drain. In the N-type MOSFET, a current direction is from the drain to the source because electrons flow from the source to the drain. In the case of a P-type MOSFET (PMOS), since the carrier is a hole, the source voltage is higher than the drain voltage so that holes can flow from the source to the drain. In the P-type MOSFET, a current flows from the source to the drain because holes flow from the source to the drain. It should be noted that the source and drain of the MOSFET are not fixed. For example, the source and drain of the MOSFET may vary depending on the applied voltage. In the following embodiments, the invention should not be limited due to the source and drain of the transistor.

The organic light emitting display device of the present invention adopts an external compensation scheme. The external compensation method senses the electrical characteristics of the driving TFT equipped in the pixel and corrects the digital data DATA of input image based on a sensing value. The electrical characteristics of the driving TFT may include the threshold voltage and the electron mobility of the driving TFT.

The timing controller 11 may temporally separate the sense driving, which senses the driving characteristics of the pixel and updates the compensation value corresponding to a sensing value, and the display driving or a display operation which displays the input image reflecting the compensation value according to a predetermined control sequence. Under the control of the timing controller 11, the external compensation operation may be performed at a vertical blank period during the display driving, or during a power-on sequence period before the display operation starts (a non-display period until an image display period in which image is displayed immediately after system power is applied), or during a power-off sequence after the display operation ends (a non-display period until the system power is turned off immediately after the image display is terminated).

The vertical blank period is a period during which input image data DATA is not written and disposed between vertical active periods during which input image data of 1 frame is written. The power-on sequence period means a transient period from when the system power is turned on until the input image is displayed. The power-off sequence period means a transient period from the end of the display of the input image until the system power is turned off.

The external compensation operation for sensing and compensating the characteristics of the driving TFT may be performed in a state in which only the screen of the display device is turned off during the period in which the system power is being applied, for example, in a standby mode, a sleep mode, a low power mode, and the like. The timing controller 11 may detect the standby mode, the sleep mode, the low power mode and the like according to a predetermined sensing process and control all operations for the external compensation operation.

The timing controller 11 generates the data control signal DDC for controlling the operation timings of the data driving circuit 12 and the gate control signal GDC for controlling the operation timings of the gate driving circuit 13, based on timing signals, such as a vertical synchronization signal Vsync, a horizontal synchronization signal Hsync, a dot clock signal DCLK, and a data enable signal DE. The timing controller 11 may temporally separate the period of performing an image display and the period of performing the external compensation operation and differently generate the control signals for the image displaying and the control signals for the external compensating.

The gate control signal GDC includes a gate start pulse GSP, a gate shift clock GSC, a gate output enable signal GOE, and the like. The gate start pulse (GSP) is applied to a gate stage that generates a first scan signal to control the gate stage to generate the first scan signal. The gate shift clock GSC is a clock signal commonly input to the gate stages, and is a clock signal for shifting the gate start pulse GSP. The gate output enable signal GOE is a masking signal that controls the output of the gate stages.

The data control signal DDC includes a source start pulse SSP, a source sampling clock SSC, a source output enable signal SOE, and the like. The source start pulse SSP controls the data sampling start timing of the data driving circuit 12. The source sampling clock SSC is a clock signal that controls the sampling timings of data in respective source drive ICs on the basis of a rising or falling edge. The source output enable signal SOE controls the output timing of the data driving circuit 12.

During the sense driving, the timing controller 11 may calculate the compensation parameter, which can compensate the change of the electric characteristics of the driving TFT, based on the digital sensing value SD input from the data driving circuit 12 and store it in the memory. The compensation parameter stored in the memory can be updated every time the sense driving is performed, and thus the time-varying characteristics of the driving TFT can be easily compensated.

During the display driving, the timing controller 11 may read the compensation parameter from the memory, correct the digital data DATA of input image based on the compensation parameter, and provides it to the data driving circuit 12.

The data driving circuit 12 may include one or more source drive ICs SDICs. Each source drive IC may comprise a plurality of digital-to-analog converters DACs connected to the data lines 14A and a sensing circuit connected to the sensing line 14B. The sensing circuit may comprises a plurality of sensing units 121 connected to neighboring two sensing lines 14B, a differential amplifier 122 and a analog-to-digital converter 123.

As shown in FIG. 3, each sensing unit is connected to an even sensing line and an odd sensing line, and commonly connected to a plurality of pixels Ps disposed in one pixel line Li through each sensing line 14B. In FIG. 3, one unit pixel comprising 4 pixels is shown to share one sensing line 14B, but the present invention does not is not limited thereto. The present invention may be applied to the various modified embodiments in which two or more pixels are connected one sensing unit through one sensing line 14B.

During the display driving, the DAC of the source drive IC converts input image data DATA into the data voltage for display according to the data control signal DDC input from the timing controller 11 and provides the data voltage to the data lines 14A. The data voltage for display is a voltage that varies depending on the gray level of input image.

During the sense driving, the DAC generates the data voltage for sensing according to the data control signal DDC input from the timing controller 11 and provides the data voltage to the data lines 14A. The data voltage for sensing is a voltage that can turn on the driving TFT equipped in the pixel during the sense driving. The data voltage for sensing may be generated as a same value for all pixels. Given that the pixel characteristics are different for each color, the data voltage for sensing may be generated with different values for each color. For example, the data voltage for sensing may be generated as a first value for first pixels displaying a first color, as a second value for second pixels displaying a second color and as a third value for third pixels displaying a third color.

The sensing unit 121 may provide a reference voltage Vref to the sensing line 14B, sample/hold the sensing value (the electrical characteristic value for OLED or the driving TFT) input through the sensing line 14B and send it to the ADC.

During the display driving, the gate driving circuit 13 generates the scan signals for display based on the gate control signal GDC and sequentially provides the scan signals to the gate lines 15 connected to the pixel lines Li, Li+1, Li+2, Li+3, . . . . The pixel line means a set of horizontally adjacent pixels. The scan signals swing between a gate high voltage VGH and a gate low voltage VGL. The gate high voltage VGH is set to a voltage higher than the threshold voltage of a TFT to turn the TFT on, and the gate low voltage VGL is lower than the threshold voltage of the TFT.

During the sense driving, the gate driving circuit 13 generates the scan signals for sensing based on the gate control signal GDC and sequentially provides the scan signals to the gate lines 15B connected to the pixel lines. The scan signal for sensing may have a wider on-pulse interval than the scan signal for display. One or more on-pulse intervals of the gate signal for sensing may be included within one line sensing on-time. Here, the one line sensing on-time means the scan time taken to simultaneously sense the pixels of one pixel line.

Figure 4:
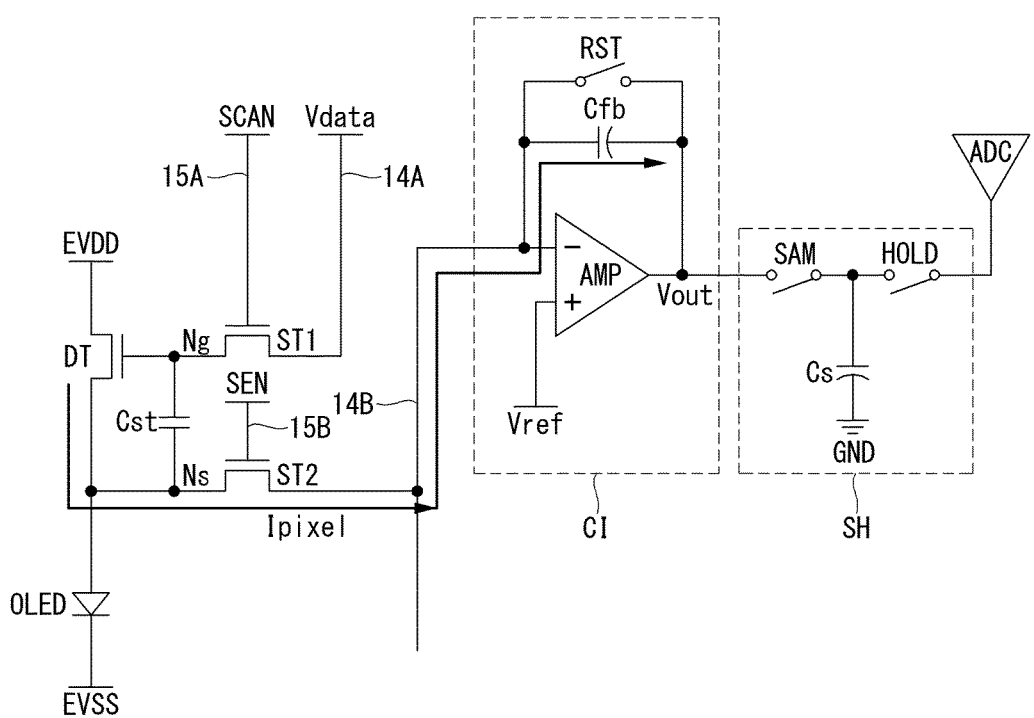
FIG. 4 shows a connection structure of a pixel and a sensing unit for implementing a current sensing method according to an embodiment of the present invention.

FIG. 4 shows a connection structure of a pixel and a sensing unit for implementing a current sensing method. FIG. 4 is merely an example for facilitating understanding of the current sensing method, and the pixel structure to which the current sensing of the present invention is applied and the driving timings thereof can be variously modified. Therefore, the technical spirit of the present invention is not limited to this embodiment.

Referring to FIG. 4, the pixel may comprise an OLED, a driving TFT DT, a storage capacitor Cst, a first switch TFT ST1, and a second switch TFT ST2.

The OLED includes an anode electrode connected to the source node Ns of the driving TFT DT, an cathode electrode connected to the input terminal of a low potential drive voltage EVSS and organic compound layers located between the anode electrode and the cathode electrode. The driving TFT DT controls the amount of the current input to the OLED according to the voltage Vgs between a gate electrode and a source electrode. The gate electrode of the driving TFT DT is connected to a gate node Ng, the drain electrode of the driving TFT DT is connected to the input terminal of a high potential drive voltage EVDD, and the source electrode of the driving TFT DT is connected to the source node Ns. The storage capacitor Cst is connected between the gate node Ng and the source node Ns. The first switch TFT SW1 applies the data voltage Vdata in the data line 14A to the gate node Ng in response to the first gate pulse SCAN. The gate electrode of the first switch TFT SW1 is connected to the first scan line 15A, the drain electrode of the first switch TFT SW1 is connected to the data line 14A and the source electrode of the first switch TFT SW1 is connected to the gate node Ng. The second switch TFT SW2 turns on/off the current flow between the source node Ns and the sensing line 14B in response to the second gate pulse SEN. The gate electrode of the second switch TFT SW2 is connected to the second gate line 15B, the drain electrode of the second switch TFT SW2 is connected to the sensing line 14B and the source electrode of the second switch TFT SW2 is connected to the source node Ns.

The first switch TFT ST1 and the second switch TFT ST2 can be driven by the first gate pulse SCAN or the second gate pulse SEN of a same phase each other in a state that the first gate line 15A and the second gate line 15B are shared.

Hereinafter, it is assumed that the first gate line 15A and the second gate line 15B are tied together to apply one gate signal.

The sensing circuit of FIG. 4 is briefly shown for explaining the operation of detecting the sensing current flowing one sensing line, and the scaler, the differential amplifier and some switches are omitted in FIG. 4 in comparison with those of FIG. 1.

The current integrator comprises an operational amplifier AMP, a feedback capacitor Cfb and a first switch SW1. The current integrator integrates the pixel current Ip to output an integral value Vsen. The operational amplifier AMP includes an inverting terminal (−) connected to the sensing line 14B to receive the pixel current Ip, a non-inverting terminal (+) receiving a reference voltage Vref and an output terminal outputting an integral value. The feedback capacitor Cfb connects the non-inverting terminal (+) and the output terminal and integrates the pixel current Ip. The first switch SW1 is connected to both ends of the feedback capacitor Cfb and the feedback capacitor Cfb is initialized when the first switch SW1 is turned on.

The sampling unit SH comprises a second switch SW2 switching according to a sampling signal SAM, a third switch SW3 switching according to a holding signal HOLD, and a sampling capacitor Cs having one end connected between the second and third switches SW2 and SW3 and the other end connected to a ground voltage source GND. The sampling unit samples and holds the integral value Vsen output from the current integrator CI.

The ADC is connected to the sampling capacitor Cs through the third switch SW3.

Figure 5:
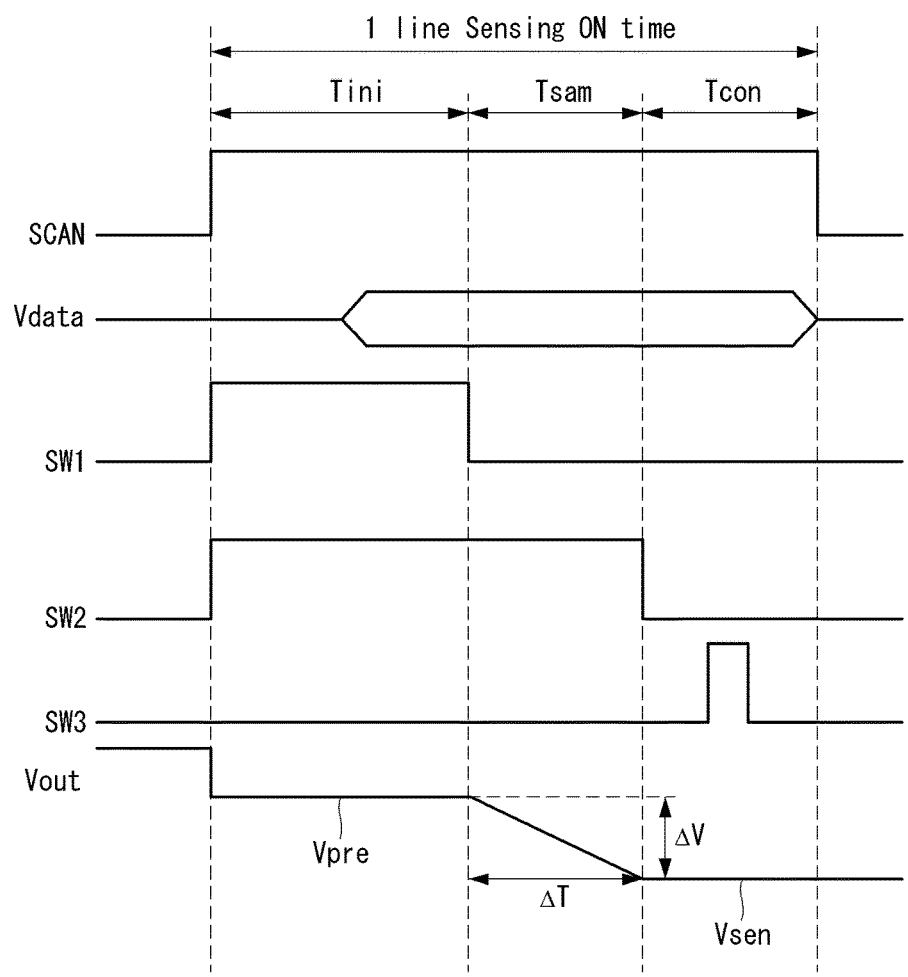
FIG. 5 shows the waveform of a sensing voltage and the timings of driving signals in an on-pulse interval of a sensing gate pulse SCAN for sensing pixels arranged in one pixel line according to an embodiment of the present invention.

FIG. 5 shows the waveform of a sensing voltage and the timings of driving signals in an on-pulse interval of a sensing gate pulse SCAN for sensing pixels arranged in one pixel line. Referring to FIG. 5, the sense driving comprises a initialization section Tini, a sampling section Tsam and a conversion section Tcon.

During the initialization section Tini, the first switch is turned on, so the amplifier AMP operates as a buffer whose gain is one. The input terminals (+/−) of the amplifier AMP, the sensing line 14B and the source node Ns are all initialized to the reference voltage Vref.

During the initialization section Tini, the data voltage for sensing Vdata is applied to the gate node Ng of a pixel through the DAC of the source drive IC. Accordingly, the pixel current Ip corresponding to the potential difference (Vdata−Vref) between the gate node Ng and the source node Ns flows the driving TFT DT. The amplifier AMP continuously operates as the buffer of gain 1 during the initialization section Tini, so the output value Vsen of the current integrator CI maintains the reference voltage Vref.

During the sampling section Tsam, the first switch SW1 is turned off, so the amplifier AMP operates as a current integrator to integrate the pixel current Ip flowing the driving TFT DT. During the sampling section Tsam, owing to the pixel current Ip applied to the non-inverting terminal (+) of the amplifier AMP, the potential difference between the both ends of the feedback capacitor Cfb becomes larger, as a sensing time ΔT becomes longer, that the amount of accumulated current increases. So, the potential of the output terminal of the amplifier AMP is lowered corresponding to the potential difference across the feedback capacitor Cfb. With this principle, the output value Vout of the current integrator CI changes to the integral value Vsen through the feedback capacitor Cfb in the sampling section Tsam. Since the descending slope with respect to the output value Vout of the current integrator CI increases as the pixel current Ip flowing through the sensing line 14B increases, the voltage difference ΔV between the reference voltage and the integral value Vsen also increases. During the sampling section, the integral value Vsen is stored in the sampling capacitor Cs via the second switch SW2.

During the conversion section Tcon, when the third switch is turned on, the integral value Vsen stored in the sampling capacitor Cs is input to the ADC via the third switch SW3. The integral value Vsen is converted into a digital sensing value SD by the ADC and then transferred to the timing controller 11. The digital sensing value SD is used by the timing controller 11 to derive the threshold voltage deviation ΔVth and the mobility deviation ΔK of the driving TFT.

The timing controller 11 stores the capacitance of the feedback capacitor Cfb, the reference voltage Vref, and the sensing time ΔT as digital codes in advance. So, the timing controller 11 can calculated the source-drain current Ids flowing the driving TFT DT from the digital sensing value SD such that Ids=Cfb*ΔV/ΔT, where ΔV=Vref−Vsen. The timing controller 11 applies the digital sensing value SD to a compensation algorithm to derive the deviation values ΔVth and ΔK and the compensation data for a deviation compensation. The compensation algorithm may be implemented as a look-up table or arithmetic logic.

Figure 6:
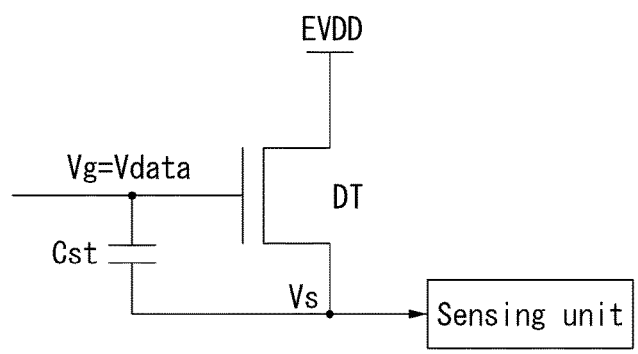
FIGS. 6 and 7 show a method of sensing the threshold voltage and the mobility of the driving TFT, respectively, according to an embodiment of the present invention.
Figure 6:
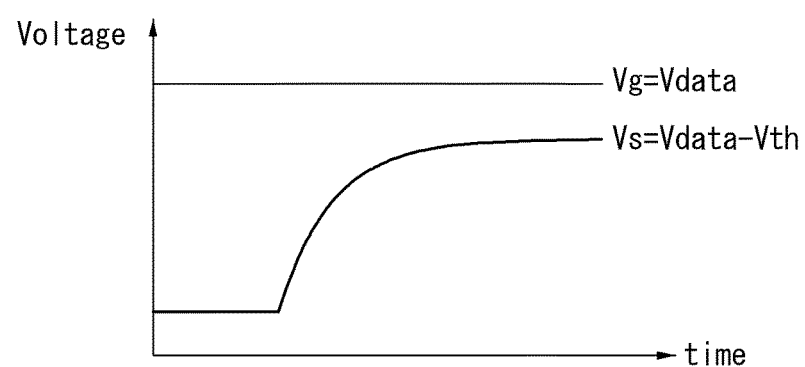
Figure 7:
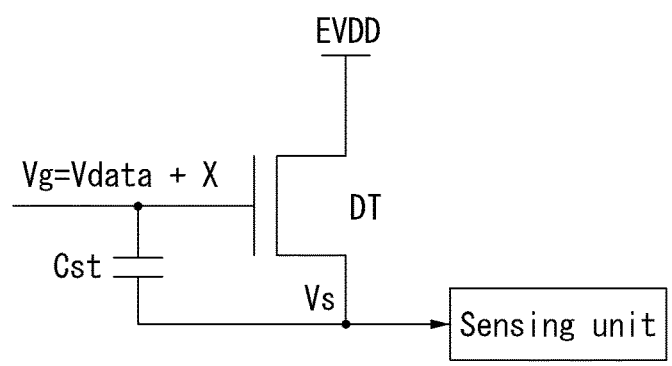
Figure 7:
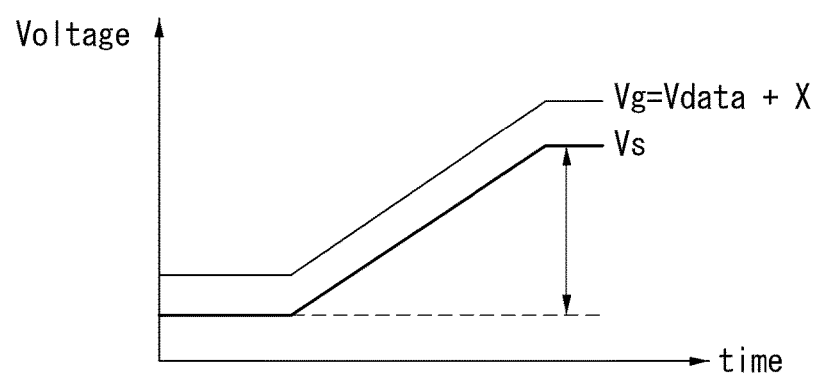

FIGS. 6 and 7 show a method of sensing the threshold voltage and the mobility of the driving TFT, respectively.

The sensing method of FIG. 6 supplies the data voltage for sensing Vdata to the gate electrode of the driving TFT DT, makes the driving TFT DT operate in a source follower method, then applies the current flowing the source electrode of the driving TFT DT to the sensing circuit and senses the threshold voltage Vth of the driving TFT DT based on the current.

The capacitor Cst for storing the gate-source voltage of the driving TFT is connected between the gate and the source electrode of the driving TFT. The source voltage Vs is expressed as Vs=Vdata−Vth. The threshold voltage of the driving TFT can be known by integrating the current flowing the source electrode of the driving TFT DT via the sensing circuit, and the offset value for compensating the threshold voltage variation of the driving TFT can be determined. The threshold voltage variation of the driving TFT can be compensated by adding the offset value to input image data. Because this method senses the threshold voltage of the driving TFT after the gate-source voltage Vgs of the driving TFT which operates in a source flower manner reaches a saturation state, a required sensing time is relatively long. When the gate-source voltage Vgs of the driving TFT is in a saturation state, a drain-source current of the driving TFT is zero.

The sensing method of FIG. 7 senses the mobility μ of the driving TFT DT. This method applies a voltage higher than the threshold voltage of the driving TFT DT (Vdata+X, here X is a voltage according to an offset compensation) to the gate electrode of the driving TFT to turn on the driving TFT, supplies the current flowing the source electrode of the driving TFT charged for a predetermined time to the sensing circuit, and senses the mobility of the driving TFT based on the current. The mobility of the driving TFT is determined according to the voltage level of the source electrode of the driving TFT, thereby obtaining the gain value for data compensation. This sensing method senses the mobility of the driving TFT when the driving TFT operates in an active section. A source voltage Vs rises along a gate voltage Vg in the active section of the driving TFT. The mobility variation amount of the driving TFT can be compensated by multiplexing input image data by the gain value. Since the mobility is sensed in the active section of the driving TFT, this sensing method requires a short time for sensing.

The sensing method of FIG. 6 may be performed until the delayed off timing of the driving power in response to the power off command signal received from a user through a user interface because of a long sensing time. The sensing method of FIG. 7 may be performed while the screens are changed after the drive power is stably supplied to the display device, that is within a vertical blank period VB because of a short sensing time. The sensing method of the present invention is not limited to those shown in FIGS. 6 and 7, and known sensing methods for sensing pixel driving characteristics may be used.

Figure 8:
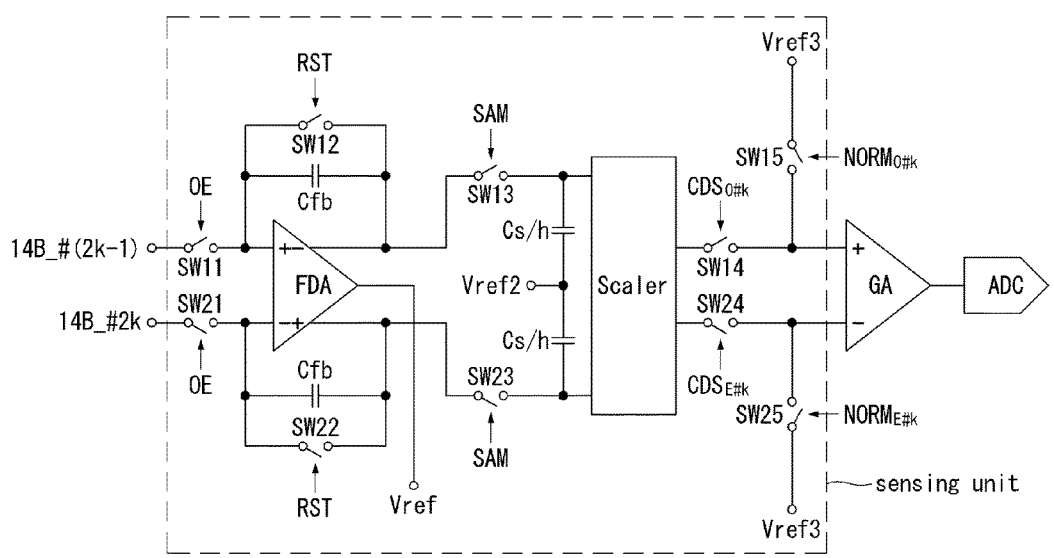
FIG. 8 shows a configuration of a sensing circuit according to an embodiment of the present invention.

FIG. 8 shows a configuration of a sensing circuit according to an embodiment of the present invention.

Referring to FIG. 8, the sensing circuit may comprise a sensing unit comprising a current integrator, a sampling unit and scaler and detecting the sensing values of two adjacent sensing lines, a differential amplifier GA for differentially amplifying two or more outputs of the sensing units, and an analog-to-digital converter ADC for converting the output of the differential amplifier.

In case that the integral value of the current in the sensing line is within the operating range of the ADC at the time of sense driving, the scaler in the sensing unit may be omitted. Or, by connecting a current sink circuit to the sensing line in parallel with the current integrator, the pixel current input to the current integrator is reduced such that the output voltage of the integrator do not deviate from the sensing range of the ADC, so the scaler may be omitted.

The current integrator integrates the currents flowing the two sensing lines by using a fully differential amplifier to output two integral values, and may comprise a fully differential amplifier FDA, two feedback capacitors Cfb and 2 reset switches SW12 and SW22.

The fully differential amplifier which configures an output as well as an input to be differential has an advantage that it can receive the signals of a maximum level so it can double a dynamic range compared to a differential amplifier. Accordingly, connecting the fully differential amplifier to a differential ADC can maximize the signal level.

A first feedback capacitor Cfb and a first reset switch SW12 connect the inverting input terminal and the non-inverting output terminal of the FDA in parallel. A second feedback capacitor Cfb and a second reset switch SW22 connect the non-inverting input terminal and the inverting output terminal of the FDA in parallel. The common output terminal of the FDA is connected to a reference voltage Vref.

The first and second feedback capacitors Cfb increase or decrease the potential of the output terminal by integrating the current flowing the sensing lines. The first and second reset switches SW12 and SW22 are initially turned on under the control of a reset signal RST, so the input terminals, the output terminal and the source electrode of the driving TFT of the pixel is initialized to the reference voltage Vref. Then, the first and second reset switches SW12 and SW22 are turned off, so the current flowing the sensing lines are integrated through the first and second feedback capacitors Cfb.

Neighboring two sensing lines, for example an odd sensing line 14B_#(2k−1) and an even sensing line 14B_#2k are respectively connected to the inverting input terminal and the non-inverting input terminal or the non-inverting input terminal and the inverting input terminal of the fully differential amplifier through the first sensing switch SW11 and the second sensing switch SW21. The first and second sensing switches SW11 and SW21 may be disconnected during the display driving causing the organic light emitting diode to emit light and connected during the sense driving measuring the driving characteristics of the organic light emitting diode, under the control of a sensing signal OE, For example, the odd sensing line 14B_#(2k−1), as shown in FIG. 3, is commonly connected to one pixel unit comprising 4 pixels adjacent in one pixel line, and the even sensing line 14B_#2k is commonly connected to 4 pixels which are adjacent in one pixel line and disposed to the right of the 4 pixels connected to the odd sensing line. One, two, three, four or more pixels may be connected to one sensing unit through one sensing line.

The sampling unit comprises first and second sampling capacitors Cs/h and first and second sampling switches SW13 and SW23 respectively connecting one ends of the first and second sampling capacitors Cs/h to the non-inverting output terminal and the inverting output terminal, and the other ends of the first and second sampling capacitors Cs/h are connected to a second reference voltage Vref2. The second reference voltage Vref2 is the voltage related to the operational range of the ADC.

The first and second sampling switches SW13 and SW23 are turned on or turned off under the control of a sampling signal SAM. When the first and second reset switches SW12 and SW22 are turned on, the first and second sampling switches SW13 and SW23 are turned on so the first and second sampling capacitors Cs/h are initialized. And, the first and second sampling switches SW13 and SW23 maintain the turn-on state for a predetermined time during which the current flowing the sensing lines is integrated through the first and second feedback capacitors Cfb, so the integral values which are the output of the current integrator are stored in the first and second sampling capacitors Cs/h. Then, the first and second sampling switches SW13 and SW23 are turned off.

The scaler converts the sensing voltages which are sampled in the first and second sampling capacitors Cs/h into the operating range of the ADC and outputs it. If the output integral values of the current integrator are within the operating range of the ADC, the scaler may be omitted.

Two outputs of the scaler may be respectively connected to two input terminal of the differential amplifier GA via first and second mode switches SW14 and SW24.

When differentially amplifying the integral values of respective currents of two sensing lines in a correlated double sampling method, all of the first and second mode switches SW14 and SW24 are connected.

The two input terminals of the differential amplifier GA are connected to a third reference voltage Vref3 via first and second reference switches SW15 and SW25, respectively. This enables the normal operating mode which differentially amplifies the integral value of the current of each sensing line with a predetermined reference value (the third reference voltage) as well as the correlated double sampling CDS operating mode which differentially amplifies the integral values of respective currents of two adjacent lines.

The third reference voltage Vref3 may have a voltage value corresponding to one obtained by adjusting the magnitude of the reference voltage Vref through the scaler.

When operating in the normal operating mode, the first mode switch SW14 is turned on so the first input terminal (non-inverting input terminal) of the differential amplifier is connected to the sensing unit which is connected to the odd sensing line 14B_#(2k−1) which is connected to the pixel to which the data voltage for sensing is applied, and the second reference switch SW25 is turned on so the other input terminal (inverting input terminal) of the differential amplifier is connected to the third reference voltage Vref3. Or, the second mode switch SW24 is turned on so the second input terminal (inverting input terminal) of the differential amplifier is connected to the sensing unit which is connected to the even sensing line 14B_#2k which is connected to the pixel to which the data voltage for sensing is applied, and the first reference switch SW15 is turned on so the other input terminal (non-inverting input terminal) of the differential amplifier is connected to the third reference voltage Vref3.

The first and second mode switches SW14 and SW24 and the first and second reference switches SW15 and SW25 are controlled by mode signals CDSO#k and CDSE#k and reference signals NORMO#k and NORME#k so the CDS operating mode or the normal operating mode can be selected.

As shown in FIG. 3, the source drive IC may comprise a plurality of sensing units, one differential amplifier and one ADC. For example, in case that one sensing line is commonly connected to four pixels (for example, R, G, B, W) in a same pixel line, and the data driving circuit 12 is equipped with m source drive ICs, since the sensing unit is connected to two adjacent sensing lines, when the lateral resolution of the display panel is H, each source drive IC comprises H/2k number of sensing units.

Two outputs of each sensing unit are respectively connected to the inverting and non-inverting input terminals of the differential amplifier. The connections may be sequentially controlled by the first and second mode switches SW14 and SW24 which are equipped in each sensing unit.

All of the sensing signal OE, the reset signal RST and the sampling signal SAM are commonly applied to all sensing units so control the corresponding switches at same timings. But, the mode signals CDSO#k and CDSE#k and the reference signals NORMO#k and NORME#k are applied to each sensing unit individually so control the corresponding switches at different timings.

When sensing the driving characteristics of the pixel in the normal operating mode, both of the two outputs of each sensing unit may be connected to one input terminal of the differential amplifier and the third reference voltage Vref3 may be connected to the other input terminal of the differential amplifier.

The sense driving may be divided into a first period which detects the driving characteristics of the pixels connected to the even sensing line and a second period which detects the driving characteristics of the pixels connected to the odd sensing line, and the order may be the second period after the first period or the first period after the second period. And, in case that one sensing line is commonly connected to two or more pixels in one pixel line, during the first period the sensing values for R pixels in all odd sensing lines may be detected, and during the second period the sensing values for R pixels in all even sensing lines may be detected. Thereafter, again during the first period the sensing values for G pixels in all odd sensing lines may be detected, and during the second period the sensing values for G pixels in all even sensing lines may be detected. In this manner, the sensing values corresponding to the driving characteristics of all R, G and B pixels (including W pixels depending on a panel type) included in on pixel line may be detected.

When detecting the driving characteristics of R pixels in the odd sensing line, the data voltage for sensing is applied to R pixel connected to an odd sensing line among R pixels in a certain pixel line, and the data voltage for turning off the driving TFT is applied to R pixel connected to an even sensing line among R pixels in the certain pixel line. In this case, the pixel current corresponding to the driving characteristics of R pixel flows through the odd sensing line and is integrated by the current integrator, and no pixel current flows through the even sensing line and only noise component is integrated by the current integrator. So, the noise component included in the odd sensing line may be removed or reduced by the noise component of the even sensing line in the differential amplifier.

The sense driving may be applied to R pixels in the even sensing line similarly, and applied to the pixels of other colors similarly.

The configuration of the sensing circuit of FIG. 8 can implement the CDS operation mode while reducing the number of amplifiers and scalers by half, compared with the configuration of the conventional sensing circuit of FIG. 1.

Figure 9:
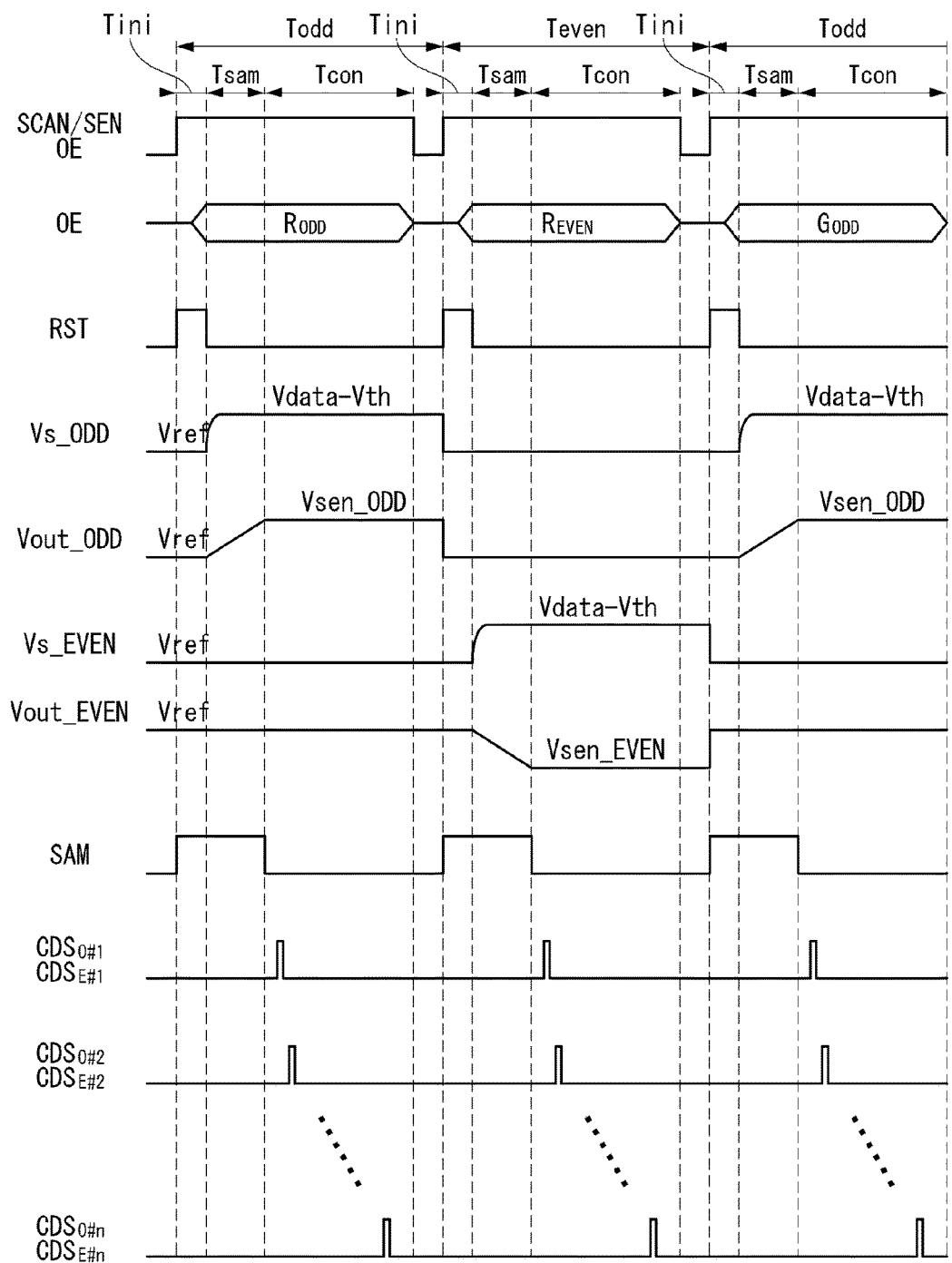
FIG. 9 shows the timings of the driving signals for driving a pixel and a sensing circuit according to an embodiment of the present invention.

FIG. 9 shows the timings of the driving signals for driving a pixel and a sensing circuit according to an embodiment of the present invention. FIG. 9 shows the process of detecting the driving characteristics of R pixels of the odd sensing line, detecting the driving characteristics of R pixels of the even sensing line, and detecting the driving characteristics of G pixels of the odd sensing line.

FIG. 9 focuses on the correlated double sampling CDS operation which differentially amplifies the integral values of the currents of two neighboring sensing lines.

The first period, during which the driving characteristics of the pixel of a certain color in the odd sensing line are detected, is displayed as Todd and the second period, during which the driving characteristics of the pixel of a certain color in the odd sensing line are detected, is displayed as Teven.

The first and second periods may include a initialization section Tini, a sampling section Tsam and a conversion section Tcon, respectively.

The initialization section Tini is the period during which respective terminals or nodes of a corresponding pixel and a corresponding sensing unit are initialized to the reference voltage Vref. The sampling section Tsam is the period during which the driving TFT of the pixel connected to the sensing line through which driving characteristics are detected is turned on, and the current flowing the sensing line is integrated and sampled (the driving TFT of the pixel connected to the sensing line through which driving characteristics are not detected is turned off, and the current flowing the sensing line is also integrated and sampled). The conversion section Tcon is the period during which two outputs which are sampled (or scaled after being sampled) in respective sensing units are differentially amplified and digitalized. The differential amplification and the digital conversion are sequentially performed for each sensing unit.

First, the first period Todd is explained during which the driving characteristics are detected of R pixel in the odd sensing line.

During the initialization section Tini, the SCAN and SEN signals (which are applied to the first and second gate lines connected to the pixel line to detect), the reset signal RST, the sensing signal OE, and the sampling signal SAM in FIG. 5 become a high logic level, so all sensing lines are connected to corresponding sensing units and the source node of the driving TFT of each pixel, the output terminal of the fully differential amplifier FDA and the sampling capacitor Cs/h are initialized by the reference voltage Vref of the common output terminal of the fully differential amplifier FDA.

During the sampling section Tsam, the reset signal SRT is changed to a low logic level, the data voltage for sensing Vdata is applied to the R pixel (exactly the gate terminal of the driving TFT) connected to the odd sensing line among R pixels in the pixel line to measure via the DAC of the data driving circuit 12, and a predetermined data voltage is applied to the remaining all pixels in the corresponding pixel line, so the driving TFT of the corresponding R pixel is turned on to make the pixel current flow and the driving TFT of the remaining R pixels are turned off. In FIG. 9, Vs_ODD is the voltage of the source terminal of the driving TFT and increases from the reference voltage of the initialization section to (Vdata−Vth). Vout_ODD is the voltage of the output terminal, feedback connected to the odd sensing line, in the fully differential amplifier, and the current flowing the odd sensing line is stored in the feedback capacitor Cfb so the voltage steadily increases over the sampling section. Vout_EVEN the voltage of the output terminal, feedback connected to the even sensing line, in the fully differential amplifier, and since a current does not flow the even sensing line (there is only noise component), there is no voltage stored in the feedback capacitor Cfb and the voltage is constant as the reference voltage Vref without a large difference from the initialization section.

During the conversion section Tcon, the sampling signal SAM becomes the low logic level, so the feedback capacitor Cfb stops accumulation and the integral value or the sensing value Vsen_ODD accumulated at the end of the sampling section Tsam is stored in the sampling capacitor Cs/h. Then, respective sensing units (in FIG. 9, from a first sensing unit to a n-th sensing unit) sequentially transition the mode signals CDSO#k and CDSE#k to a high logic level to sequentially connect corresponding sensing units to the differential amplifier, the differential amplifier differentially amplifies the sensing value Vsen_ODD of the odd sensing line and the sensing value Vsen_EVEN of the even sensing line of the corresponding sensing unit and the ADC converts it into digital and outputs the converted value as the digital sensing value for R pixel of the odd sensing line.

Next, the second period Teven is explained during which the driving characteristics are detected of R pixel in the even sensing line.

During the initialization section Tini, the SCAN and SEN signals, the reset signal RST, the sensing signal OE, and the sampling signal SAM become a high logic level, so all sensing lines are connected to corresponding sensing units and the source node of the driving TFT of each pixel, the output terminal of the fully differential amplifier FDA and the sampling capacitor Cs/h are initialized by the reference voltage Vref of the common output terminal of the fully differential amplifier FDA.

During the sampling section Tsam, the reset signal SRT is changed to a low logic level, the data voltage for sensing Vdata is applied to the R pixel (exactly the gate terminal of the driving TFT) connected to the even sensing line among R pixels in the pixel line to measure via the DAC of the data driving circuit 12, and a predetermined data voltage is applied to the remaining all pixels in the corresponding pixel line, so the driving TFT of the corresponding R pixel is turned on to make the pixel current flow and the driving TFT of the remaining R pixels are turned off. In FIG. 9, Vs_EVEN is the voltage of the source terminal of the driving TFT and increases from the reference voltage of the initialization section to (Vdata−Vth). Vout_EVEN is the voltage of the output terminal, feedback connected to the even sensing line, in the fully differential amplifier, and the current flowing the even sensing line is stored in the feedback capacitor Cfb so the voltage steadily decreases over the sampling section. Vout_ODD the voltage of the output terminal, feedback connected to the odd sensing line, in the fully differential amplifier, and since a current does not flow the odd sensing line (there is only noise component), there is no voltage stored in the feedback capacitor Cfb and the voltage is constant as the reference voltage Vref without a large difference from the initialization section.

During the conversion section Tcon, the sampling signal SAM becomes the low logic level, so the feedback capacitor Cfb stops accumulation and the integral value or the sensing value Vsen_EVEN accumulated at the end of the sampling section Tsam is stored in the sampling capacitor Cs/h. Then, respective sensing units (in FIG. 9, from a first sensing unit to a n-th sensing unit) sequentially transition the mode signals CDSO#k and CDSE#k to a high logic level to sequentially connect corresponding sensing units to the differential amplifier, the differential amplifier differentially amplifies the sensing value Vsen_EVEN of the even sensing line and the sensing value Vsen_ODD of the odd sensing line of the corresponding sensing unit and the ADC converts it into a digital value and outputs the converted value as the digital sensing value for R pixel of the even sensing line.

During next first period Todd, the driving characteristics are detected of B pixel in the odd sensing line. But, it is almost same as that of detecting the driving characteristics of R pixel in the odd sensing line, so the explanation thereof is omitted.

Figure 10:
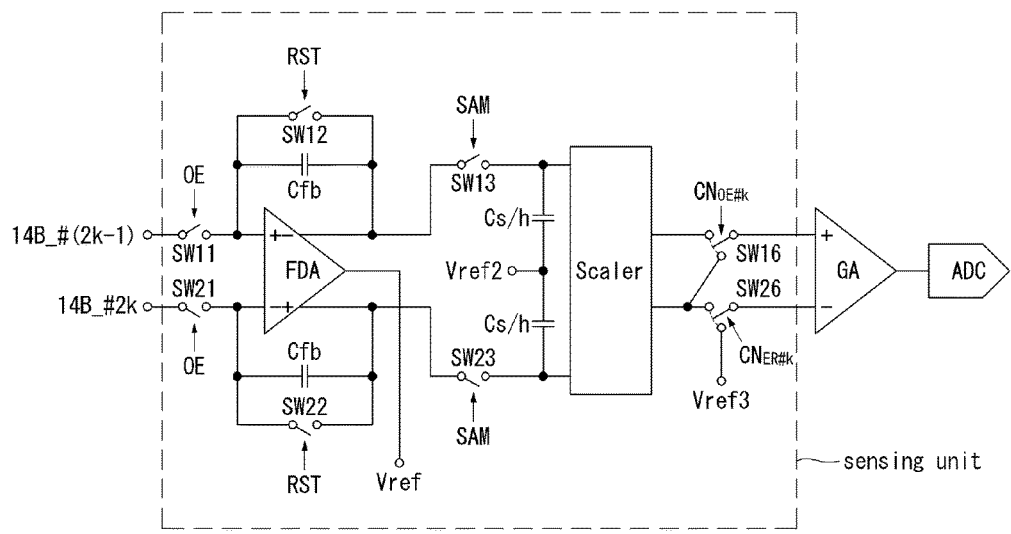
FIG. 10 shows a configuration of a sensing circuit according to another embodiment of the present invention.

FIG. 10 shows a configuration of a sensing circuit according to another embodiment of the present invention.

The configuration of FIG. 10 is the same as that of FIG. 8 except that the first and second reference switches SW15 and SW25 are omitted and the first and second mode switches SW14 and SW24 are changed into third and fourth mode switches SW16 and SW26. The connections of the third and fourth mode switches SW16 and SW26 are different from the embodiment of FIG. 8 when the sensing unit is sequentially connected the differential amplifier.

The third mode switch SW16 may connect one input terminal of the differential amplifier GA to the sensing value sensed in the odd sensing line or the sensing value sensed in the even sensing line, according to the first mode selection signal CNOE#k. The fourth mode switch SW26 may connect the other input terminal of the differential amplifier GA to the sensing value sensed in the even sensing line or the third reference voltage Vref3, according to the second mode selection signal CNER#k.

When operating in the CDS operating mode, during the first and second period Todd and Teven, the third mode switch SW16 may connect one input terminal of the differential amplifier GA to the sensing value sampled in the odd sensing line, and the fourth mode switch SW26 may connect the other input terminal of the differential amplifier GA to the sensing value sampled in the even sensing line.

When operating in the normal operating mode, during the first period Todd, the third mode switch SW16 may connect one input terminal of the differential amplifier GA to the sensing value sampled in the odd sensing line and the fourth mode switch SW26 may connect the other input terminal of the differential amplifier GA to the third reference voltage Vref3, and during the second period, the third mode switch SW16 may connect one input terminal of the differential amplifier GA to the sensing value sampled in the even sensing line and the fourth mode switch SW26 may connect the other input terminal of the differential amplifier GA to the third reference voltage Vref3.

Throughout the description, it should be understood by those skilled in the art that various changes and modifications are possible without departing from the technical principles of the present invention. Therefore, the technical scope of the present invention is not limited to the detailed descriptions in this specification but should be defined by the scope of the appended claims.

What is claimed is:

1. A circuit for detecting driving characteristics of an organic light emitting diode (OLED), the circuit comprising:
    an integrator configured to integrate currents which respectively flow adjacent two sensing lines connected to an inverting input terminal and a non-inverting input terminal of a fully differential amplifier, the sensing line being connected to a driving thin film transistor (TFT) for driving the OLED constituting a pixel of a display panel;
    a sampling unit configured to respectively sample two integral outputs of the integrator;
    a differential amplifier configured to differentially amplify one or more sampling outputs of the sampling unit; and
    an analog-to-digital converter (ADC) configured to convert an output of the differential amplifier into a digital sensing value.

2. The circuit of claim 1, further comprising:
a scaler configured to respectively convert two sampling outputs of the sampling unit into an operating range of the ADC, and output a result to the differential amplifier.

3. The circuit of claim 1, further comprising:
first and second sensing switches configured to respectively couple the inverting input terminal and the non-inverting input terminal to the two sensing lines so as to disconnect at a time of display driving for making the OLED emit light and to connect at a time of sense driving for detecting the driving characteristics of the OLED; and
first and second mode switches configured to respectively couple two sampling outputs of the sampling unit to two input terminals of the differential amplifier,
wherein the integrator comprises a first capacitor and a first reset switch connecting the inverting input terminal and a non-inverting output terminal of the fully differential amplifier and a second capacitor and a second reset switch connecting the non-inverting input terminal and an inverting output terminal of the fully differential amplifier, and a common output terminal of the fully differential amplifier is connected to a reference voltage to be applied to a source electrode of the driving TFT, and
wherein the sampling unit comprises first and second sampling capacitors and first and second sampling switches for respectively coupling first terminals of the first and second sampling capacitors to the non-inverting output terminal and the inverting output terminal, and second terminals of the first and second sampling capacitors are connected to a second reference voltage related to an operating range of the ADC.

4. The circuit of claim 3, wherein the first mode switch selectively connects a first sampling output or a second sampling output to a first input terminal of the differential amplifier, and the second mode switch selectively connects the second sampling output or a third reference voltage to a second input terminal of the differential amplifier.

5. The circuit of claim 4, wherein in a first mode using a difference value between sensing values of the two sensing lines, the first mode switch connects the first input terminal of the differential amplifier to the first sampling output and the second mode switch connects the second input terminal of the differential amplifier to the second sampling output, and
wherein in a second mode using a difference value between each sensing value of the two sensing lines and a predetermined reference value, the first mode switch connects the first input terminal of the differential amplifier to the first sampling output and the second mode switch connects the second input terminal of the differential amplifier to the third reference voltage, or the first mode switch connects the first input terminal of the differential amplifier to the second sampling output and the second mode switch connects the second input terminal of the differential amplifier to the third reference voltage.

6. The circuit of claim 3, further comprising:
a first reference switch configured to couple a first input terminal of the differential amplifier to a third reference voltage; and
a second reference switch configured to couple a second input terminal of the differential amplifier to the third reference voltage.

7. The circuit of claim 6, wherein in a first mode using a difference value between sensing values of the two sensing lines, the first mode switch connects the first input terminal of the differential amplifier to the first sampling output and the second mode switch connects the second input terminal of the differential amplifier to the second sampling output, and
wherein in a second mode using a difference value between each sensing value of the two sensing lines and a predetermined reference value, the first mode switch connects the first input terminal of the differential amplifier to the first sampling output and the second reference switch connects the second input terminal of the differential amplifier to the third reference voltage, or the second mode switch connects the second input terminal of the differential amplifier to the second sampling output and the first reference switch connects the first input terminal of the differential amplifier to the third reference voltage.

8. The circuit of claim 3, wherein during an initialization section, the first and second sensing switches, the first and second reset switches, and the first and second sampling switches are turned on and the reference voltage is applied to a source electrode of the driving TFT,
during a sampling section, the first and second reset switches are turned off, a data voltage for sensing is applied to a gate electrode of a first driving TFT connected to one of the two sensing lines to turn on the first driving TFT, a predetermined data voltage is applied to a second driving TFT connected to the other of the two sensing lines to turn off the second driving TFT, one of the first and second sampling capacitors stores a first integral output which the integrator integrates a current flowing the source electrode of the first driving TFT to output, and the other of the first and second sampling capacitors stores a second integral output which the integrator integrates a current flowing the source electrode of the second driving TFT to output, and
during a conversion section, the first and second sampling switches are turned off, the first and second mode switches are turned on, and the differential amplifier and the ADC convert a difference between the first and second integral outputs stored in the first and second sampling capacitors into a digital value.

9. An organic light emitting display device, comprising:
a display panel equipped with a plurality of pixels each of which includes an organic light emitting diode (OLED) and a driving thin film transistor (TFT) for driving the OLED; and
a sensing circuit connected to one or more pixels through a sensing line and configured to detect driving characteristics of a corresponding pixel,
wherein the sensing circuit comprises:
a plurality of sensing units each of which including an integrator configured to integrate currents which respectively flow adjacent two sensing lines connected to an inverting input terminal and a non-inverting input terminal of a fully differential amplifier, a sampling unit configured to respectively sample two integral outputs of the integrator; and a scaler configured to regulate an operating range of outputs of the sampling unit;
a differential amplifier configured to differentially amplify one or more outputs of the scaler; and
an analog-to-digital converter (ADC) configured to convert an output of the differential amplifier into a digital sensing value.

10. The organic light emitting display device of claim 9, wherein the sensing unit further comprises:
first and second sensing switches configured to respectively couple the inverting input terminal and the non-inverting input terminal to the two sensing lines so as to disconnect at a time of display driving for making the OLED emit light and to connect at a time of sense driving for detecting the driving characteristics of the OLED; and
first and second mode switches configured to respectively couple two sampling outputs of the sampling unit to two input terminals of the differential amplifier,
wherein the integrator comprises a first capacitor and a first reset switch connecting the inverting input terminal and a non-inverting output terminal of the fully differential amplifier and a second capacitor and a second reset switch connecting the non-inverting input terminal and an inverting output terminal of the fully differential amplifier, and a common output terminal of the fully differential amplifier is connected to a reference voltage to be applied to a source electrode of the driving TFT, and
wherein the sampling unit comprises first and second sampling capacitors and first and second sampling switches for respectively coupling first terminals of the first and second sampling capacitors to the non-inverting output terminal and the inverting output terminal, and second terminals of the first and second sampling capacitors are connected to a second reference voltage related to an operating range of the ADC.

11. The organic light emitting display device of claim 10, wherein during a first period, a data voltage for sensing which can turn on the driving TFT is applied to a pixel connected to an odd sensing line, a predetermined data voltage which cannot turn on the driving TFT is applied to a pixel connected to an even sensing line, the plurality of sensing units are driven simultaneously to obtain a plurality of first and second scaling outputs, and the first and second mode switches are controlled such that the plurality of sensing units are sequentially connected to the differential amplifier and when each sensing unit is connected to the differential amplifier, the differential amplifier and the ADC are driven to output a digital sensing value for the pixels connected to the odd sensing lines related to a corresponding sensing unit, and
wherein during a second period following the first period, the predetermined data voltage which cannot turn on the driving TFT is applied to a pixel connected to an odd sensing line, a data voltage for sensing which can turn on the driving TFT is applied to a pixel connected to an even sensing line, the plurality of sensing units are driven simultaneously to obtain a plurality of first and second scaling outputs, and the first and second mode switches are controlled such that the plurality of sensing units are sequentially connected to the differential amplifier and when each sensing unit is connected to the differential amplifier, the differential amplifier and the ADC are driven to output a digital sensing value for the pixels connected to the even sensing lines related to a corresponding sensing unit.

* * * * *